US008044837B2

(12) United States Patent
Mboli

(10) Patent No.: US 8,044,837 B2
(45) Date of Patent: Oct. 25, 2011

(54) ANALOGUE TO DIGITAL CONVERTERS

(75) Inventor: Jean Claude Mboli, Roques sur Garonne (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/531,912

(22) PCT Filed: Mar. 26, 2007

(86) PCT No.: PCT/IB2007/051440
§ 371 (c)(1),
(2), (4) Date: Sep. 18, 2009

(87) PCT Pub. No.: WO2008/117134
PCT Pub. Date: Oct. 2, 2008

(65) Prior Publication Data
US 2010/0013691 A1    Jan. 21, 2010

(51) Int. Cl.
*H03M 1/12*        (2006.01)
(52) U.S. Cl. ........ 341/155; 341/118; 341/120; 341/122; 341/172; 341/143
(58) Field of Classification Search .......... 341/118–122, 341/143, 155, 166, 172
See application file for complete search history.

(56) References Cited

U.S. PATENT DOCUMENTS

| 4,291,299 | A | * | 9/1981 | Hinz et al. ..................... 341/123 |
| 4,764,753 | A | * | 8/1988 | Yukawa ......................... 341/166 |
| 5,248,974 | A | * | 9/1993 | Fattaruso et al. ............. 341/172 |
| 5,659,309 | A | * | 8/1997 | Takashi et al. ................. 341/50 |
| 5,831,562 | A | * | 11/1998 | Van Auken et al. ........... 341/122 |
| 6,198,313 | B1 | * | 3/2001 | Poucher et al. ................. 327/91 |
| 6,215,427 | B1 | * | 4/2001 | Bonhoure et al. ............ 341/118 |
| 7,242,333 | B1 | * | 7/2007 | Wu ............................... 341/122 |
| 7,382,153 | B2 | * | 6/2008 | Ou-yang et al. ................ 326/30 |
| 7,576,668 | B2 | * | 8/2009 | Udupa et al. .................. 341/122 |
| 7,623,056 | B2 | * | 11/2009 | Yamashita .................... 341/163 |
| 7,796,069 | B2 | * | 9/2010 | Li ................................. 341/122 |
| 2005/0146453 | A1 | * | 7/2005 | Jensen .......................... 341/131 |
| 2007/0001893 | A1 | * | 1/2007 | Shinohara .................... 341/169 |
| 2007/0030191 | A1 | * | 2/2007 | Muramatsu et al. .......... 341/155 |
| 2007/0236380 | A1 | * | 10/2007 | La Rue et al. ................. 341/155 |

FOREIGN PATENT DOCUMENTS

| DE | 4306646 A1 | 9/1993 |
| JP | 09280928 A | 10/1997 |

OTHER PUBLICATIONS

Allier E. et. al.: "Asynchronous Level Crossing Analog to Digital Converters" Measurement, Institute of Measurement and Control. London, GB. vol. 37, No. 4, Jun. 4, 2005, pp. 296-309.
Kruezer M.: "Multichannel System for High Precision Static and Fast Dynamic Measurement" Measurement, Institute of Measurement and Control. London, GB. vol. 10, No. 1, Jan. 1, 1992, pp. 8-13.
International Search Report and Written Opinion correlating to PCT/IB2007/051440 dated Feb. 3, 2009.

* cited by examiner

*Primary Examiner* — Linh Nguyen

(57) ABSTRACT

An analogue to digital converter (ADC) is provided which comprises an signal sampling device, a signal comparison device, and a digital signal generator. An analogue signal to be converted to a digital signal is input into the ADC, the signal sampling device produces samples of the analogue signal, the signal comparison device receives the analogue signal and the analogue signal samples, performs a comparison between them and outputs comparison signals, and the digital signal generator receives the comparison signals and uses them to generate a digital signal.
The signal sampling device may produce voltage samples or current samples of the analogue signal.

20 Claims, 4 Drawing Sheets

US 8,044,837 B2

ANALOGUE TO DIGITAL CONVERTERS

FIELD OF THE INVENTION

This invention relates to improvements relating to analogue to digital converters (ADCs).

BACKGROUND OF THE INVENTION

ADCs are a common component of many electronic devices. Conventional ADCs are based on time sampling of the analogue input signal, the converted digital signal being dependent on the value of the analogue signal at each time instant at which the analogue input signal is sampled. This results in a number of drawbacks of conventional ADCs. As analogue to digital conversion takes place at a number of discrete, spaced time instants, it is not possible to determine the analogue input signal value between two sampling time instants. For time-varying analogue input signals, unnecessary conversions to digital signals are performed when the analogue input signals are, temporarily, nearly constant. At each sampling time instant, the digital signal is produced from scratch by conversion of the value of the analogue input signal at the time instant, and the resultant digital signal cannot be predicted. The consequence of this is that it is necessary to carry out a sophisticated set of operations to convert the analogue input signal, each time this signal is sampled, regardless of what operations have been performed in conversions of the analogue input signal at previous time instants. This necessitates the use of complex ADC architecture, to perform complex analogue/digital operations. Such ADCs have undesirably high power consumption and large size. Optimisation of ADC operational characteristics (power consumption, size, resolution, speed, etc.) and also cost, is therefore of great importance.

One example where such ADC optimisation is particularly desirable is in portable devices, such as cellular phones, laptops and heart pacemakers, where it is important to conserve the power of the usually lifetime-limited power source, e.g. a battery. In cellular phone and laptop portable devices, there is a need to continuously monitor the voltage of the battery of the device, preferably both during an operational mode and a stand-by mode of the device. This is desired by many functions of the power management integrated circuit (PMIC) of the device. Monitoring of the battery voltage requires an ADC which is sufficiently fast to track rapid changes of the voltage, and which can avoid reaction to unwanted voltage spikes. Such an ADC function may be provided by running software conversions through the high resolution, general purpose ADC found on the PMIC of the device. However, this ADC uses conventional time-sampling of the battery voltage analogue signal, which requires use of a clock. Such use by the ADC, results in a not inconsequential power consumption by the ADC function. In addition, during the stand-by mode of the device, the only available clock is provided by a low frequency crystal oscillator. Such a low frequency clock cannot be used in the ADC function, so monitoring of the voltage of the battery is interrupted. Thus there is a need for an ADC which addresses these problems.

In pacemakers, the power source (battery) is not readily accessible for recharging or replacing. It is therefore of critical importance to limit, as much as possible, the power consumption of the battery. This is not entirely achievable by use of conventional ADCs and associated clocks.

SUMMARY OF THE INVENTION

The present invention provides an analogue to digital converter and a method of converting an analogue signal to a digital signal as described in the accompanying claims.

BRIEF DESCRIPTION OF THE DRAWINGS

Reference will now be made, by way of example, to the accompanying drawings, in which.

DETAILED DESCRIPTION OF THE PREFERRED EMBODIMENTS

Figure 1:
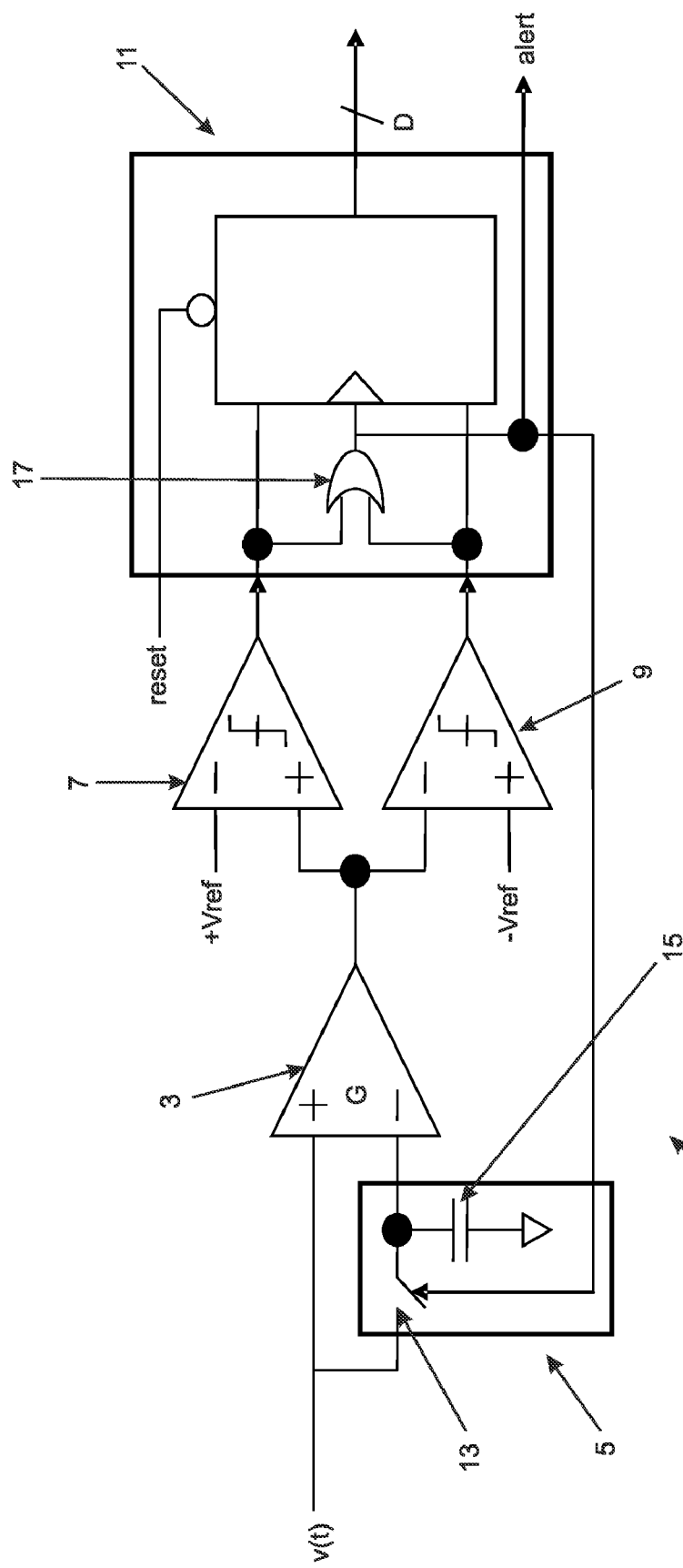
FIG. 1 is a schematic representation of an analogue to digital converter in accordance with a first embodiment of the invention, given by way of example.

Referring to FIG. 1, a first embodiment of the invention comprises an analogue to digital converter (ADC) 1. This comprises an amplifier/subtracter 3, a signal sample and hold system 5, a first comparator 7, a second comparator 9, and an N-bit counter 11. An analogue signal, which is to be converted to a digital signal, is input into the amplifier/subtracter 3. The analogue signal is also, periodically, input into the signal sample and hold system 5. This comprises a switch 13 and a signal storage device 15, in the form of a capacitor. On closure of the switch 13, the signal sample and hold system 5 samples the analogue signal, and stores the signal sample in the capacitor 15.

The amplifier/subtracter 3 receives a first signal on input designated +, and receives a second signal on input designated −. The amplifier/subtracter 3 subtracts the second signal from the first signal, amplifies the resultant signal, and outputs this to each of the comparators 7, 9.

The first comparator 7 receives the signal from the amplifier/subtracter 3 on input designated +, and receives a signal Vref on input designated −. The first comparator 7 compares the two signals, and if the signal on the input designated + is greater than the signal on the input designated −, outputs a digital signal comprising a 1 to the N-bit counter 11. The second comparator 9 receives the signal from the amplifier/subtracter 3 on input designated −, and receives a signal −Vref on input designated +. The second comparator 9 compares the two signals, and if the signal on the input designated + is greater than the signal on the input designated −, outputs a digital signal comprising a 1 to the N-bit counter 11. Either a signal from the first comparator 7 or a signal from the second comparator 9 will be output to the N-bit counter 11, i.e. signals from both of the comparators 7, 9 are not output simultaneously to the N-bit counter 11.

The N-bit counter 11 comprises a counter portion. This receives the output signals from the first and second comparators 7, 9. On receipt of a signal from the first comparator 7, the counter portion is caused to increment by a value of 1. On receipt of a signal from the second comparator 9, the counter portion is caused to decrement by a value of 1. The value of the counter portion forms the digital signal, D, equivalent to the analogue input signal, and the N-bit counter 11 outputs this signal from the ADC 1.

The N-bit counter 11 further comprises an OR gate 17. This receives the signals from both the first comparator 7 and the second comparator 9. On receipt of a signal from either comparator, the OR gate 17 outputs a sample control signal. These are received by the signal sample and hold system 5, and each sample control signal causes the switch 13 of the signal sample and hold system 5 to temporarily close, and a sample of the analogue signal is taken and is stored in the capacitor 15. The time at which a sample of the analogue signal is taken, may be designated $t=t_n, t_{n+1}, t_{n+2}, \ldots$.

The architecture of the ADC 1 of this embodiment of the invention, is based on voltage sampling of the analogue input signal, as follows.

Before commencing use of the ADC 1, it is intialised. For example, the N-bit counter 11 is reset to initial conditions, it is ensured that the switch 13 of the signal sample and hold system 5 is open and the capacitor 15 is discharged.

An analogue signal having a time-varying voltage, v(t), which is to be converted to a digital signal, is applied to the amplifier/subtracter 3. The voltage of the analogue signal will initially be zero. As the switch 13 is open, this voltage signal is not also applied to the capacitor 15. The amplifier/subtracter 3 therefore receives a zero voltage signal on the input designated +, and a zero voltage signal on the input designated −. The amplifier/subtracter 3 subtracts the two signals, amplifies the resultant signal, and outputs a zero voltage signal to each of the comparators 7, 9.

The first comparator 7 receives the zero voltage signal from the amplifier/subtracter 3 on its input designated +, and receives a signal Vref on its input designated −, where Vref=LSB×G, (LSB=least significant bit). The first comparator 7 compares the two signals, and as the zero voltage signal is not greater than Vref, does not output a digital signal to the N-bit counter 11.

The second comparator 9 receives the zero voltage signal from the amplifier/subtracter 3 on its input designated −, and receives a signal −Vref on its input designated +, where −Vref=−LSB×G. The second comparator 9 compares the two signals, and as the signal −Vref is not greater than the zero voltage signal does not output a digital signal comprising a 1 to the N-bit counter 11.

The counter portion of the N-bit counter 11 does not therefore receive a signal from either the first comparator 7 or the second comparator 9. The un-amended value of the counter portion, i.e. zero, is output from the ADC 1, as the digital signal, D, equivalent to the zero voltage analogue signal input into the amplifier/subtracter 3.

The analogue signal having a time-varying voltage, v(t), which is to be converted to a digital signal, continues to be applied to the amplifier/subtracter 3, and the voltage of this signal will rise from its initial zero value. As the switch 13 is still open, this voltage signal is not also applied to the capacitor 15. The amplifier/subtracter 3 therefore receives the voltage signal, v(t), on the input designated +, and a signal equal to zero on the input designated −. The amplifier/subtracter 3 subtracts the zero signal from the voltage signal, amplifies the resultant signal by a gain of G, and outputs this to each of the comparators 7, 9. The output signal is therefore (v(t)−0)×G.

The first comparator 7 receives the signal from the amplifier/subtracter 3, (v(t)−0)×G, on its input designated +, and receives a signal Vref on its input designated −, where Vref=LSB×G, (LSB=least significant bit). The first comparator 7 compares the two signals, and if the signal (v(t)−0)×G is greater than Vref, i.e. if (v(t)−0)×G>LSB×G or (v(t)−0)>LSB, outputs a digital signal comprising a 1 to the N-bit counter 11.

The second comparator 9 receives the signal from the amplifier/subtracter 3, (v(t)−0)×G, on its input designated −, and receives a signal −Vref on its input designated +, where −Vref=−LSB×G. The second comparator 9 compares the two signals, and if the signal −Vref is greater than the signal (v(t)−0)×G, i.e. if −LSB×G>(v(t)−0)×G, or −LSB>(v(t)−0), outputs a digital signal comprising a 1 to the N-bit counter 11.

If the voltage of the analogue input signal is considered to vary from −V to +V, and the ADC 1 provides N+1 bit resolution, then 1 LSB=V/$2^N$. The magnitude of the voltage of the analogue input signal will therefore be greater than 1 LSB, i.e. greater than the magnitude of the signal Vref. So the first comparator 7, but not the second comparator 9, will output a signal to the N-bit counter 11.

On receipt of the signal from the first comparator 7, the counter portion of the N-bit counter 11 is caused to increment by a value of 1. The value of the counter portion is output from the ADC 1, as the digital signal, D(n), equivalent to the analogue voltage signal input into the amplifier/subtracter 3.

The OR gate 17 of the N-bit counter 11, also receives the signal from the first comparator 7. On receipt of this, the OR gate 17 outputs a sample control signal to the signal sample and hold system 5. This causes the switch 13 of the signal sample and hold system 5 to temporarily close, and a sample of the voltage signal, v($t_n$), where n represents the sample time, is taken and is stored in the capacitor 15. It will be appreciated that the above process occurs very rapidly, more rapidly than the time variation of the voltage of the analogue input signal. Therefore the magnitude of the voltage of the signal sample received by the capacitor 15 will be equal to the magnitude of the voltage signal which was input into the amplifier/subtracter 3.

The voltage signal stored by the capacitor 15 is input into the input designated − of the amplifier/subtracter 3. The input designated + of the amplifier/subtracter 3 continues to receive the time-varying voltage analogue signal, v(t). The amplifier/subtracter 3 subtracts the voltage signal received from the capacitor 15 from the time-varying voltage signal, amplifies the resultant signal by a gain of G, and outputs this to each of the comparators 7, 9. The output signal is therefore (v(t)−v($t_n$))×G. The amplifier/subtracter 3 therefore determines the difference between the voltage of the received time-varying analogue signal and a previous value of the voltage of the analogue signal.

As before, the first comparator 7 receives the signal from the amplifier/subtracter 3, now (v(t)−v($t_n$))×G, on its input designated +, and receives a signal Vref on its input designated −, where Vref=LSB×G. The first comparator 7 compares the two signals, and if the signal (v(t)−v($t_n$))×G is greater than Vref, i.e. if (v(t)−v($t_n$))×G>LSB×G or (v(t)−v($t_n$))>LSB, outputs a digital signal comprising a 1 to the N-bit counter 11.

Also, as before, the second comparator 9 receives the signal from the amplifier/subtracter 3, now (v(t)−v($t_n$))×G, on its input designated −, and receives a signal −Vref on its input designated +, where −Vref=−LSB×G. The second comparator 9 compares the two signals, and if the signal −Vref is greater than the signal (v(t)−v($t_n$))×G, i.e. if −LSB×G>(v(t)−v($t_n$))×G, or −LSB>(v(t)−v($t_n$)), outputs a digital signal comprising a 1 to the N-bit counter 11.

Therefore, if the voltage of the received time-varying analogue signal, v(t), differs from the previous value of the voltage of the analogue signal, v($t_n$), by +/−1 LSB, either the first or the second comparator will output a signal. The ADC 1 therefore detects variations of +/−1 LSB in the voltage of the received analogue signal. If the voltage of the received time-varying analogue signal, v(t), does not differ from the previous value of the voltage of the analogue signal, $v(t_n)$, by +/−1 LSB, neither the first or the second comparator outputs a signal.

If the N-bit counter 11 receives a signal from the first comparator 7, the counter portion thereof is caused to increment by a value of 1. If the N-bit counter 11 receives a signal from the second comparator 9, the counter portion thereof is caused to decrement by a value of 1. The value of the counter portion is, as before, output from the ADC 1, as the digital signal equivalent to the analogue voltage signal, v(t), input into the amplifier/subtracter 3.

The OR gate 17 of the N-bit counter 11, also receives any signal from the first comparator 7 or second comparator 9. On receipt of this, the OR gate 17 outputs a sample control signal to the signal sample and hold system 5. This causes the switch 13 of the signal sample and hold system 5 to temporarily close, and a sample of the voltage signal, $v(t_{n+1})$, is taken and is stored in the capacitor 15.

At the time the time-varying analogue signal is converted, its voltage value is exactly known. Each equivalent digital signal, D, is therefore predictable, using D(n)−D(n−1)=+/−1 LSB.

The resolution of the ADC 1 is given by $N=\log 2 (V/LSB)+1=\log 2 (G \times V/Vref)+1$.

Figure 2:
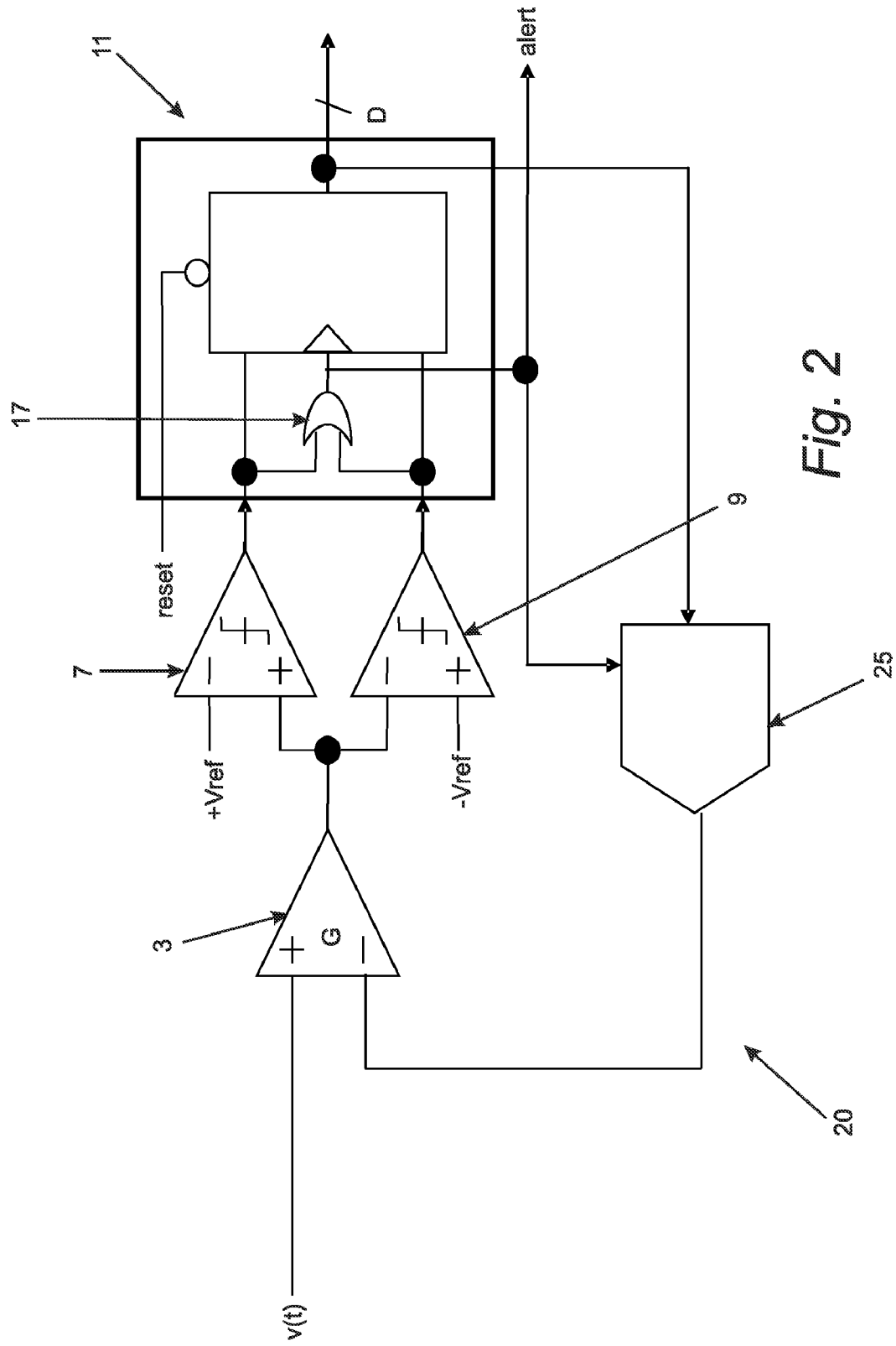
FIG. 2 is a schematic representation of an analogue to digital converter in accordance with a second embodiment of the invention, given by way of example.

Referring to FIG. 2, a second embodiment of the invention comprises an analogue to digital converter (ADC) 20. This is similar to the ADC 1 of FIG. 1, and like reference numerals have been used to denote like components. In this embodiment of the invention, however, the signal sample and hold system 25 comprises an M-bit digital to analogue converter (DAC), where M>N. This replaces the switch and capacitor of the signal sample and hold system 5. The advantages of this are that there is no need for provision of a switch and capacitor in the signal sample and hold system, and therefore no leakage of the capacitor. The drawbacks are increased power consumption of the ADC 20 (the DAC settling time must be as short as the sampling time of the capacitor) and an increase in size of the ADC 20.

Figure 3:
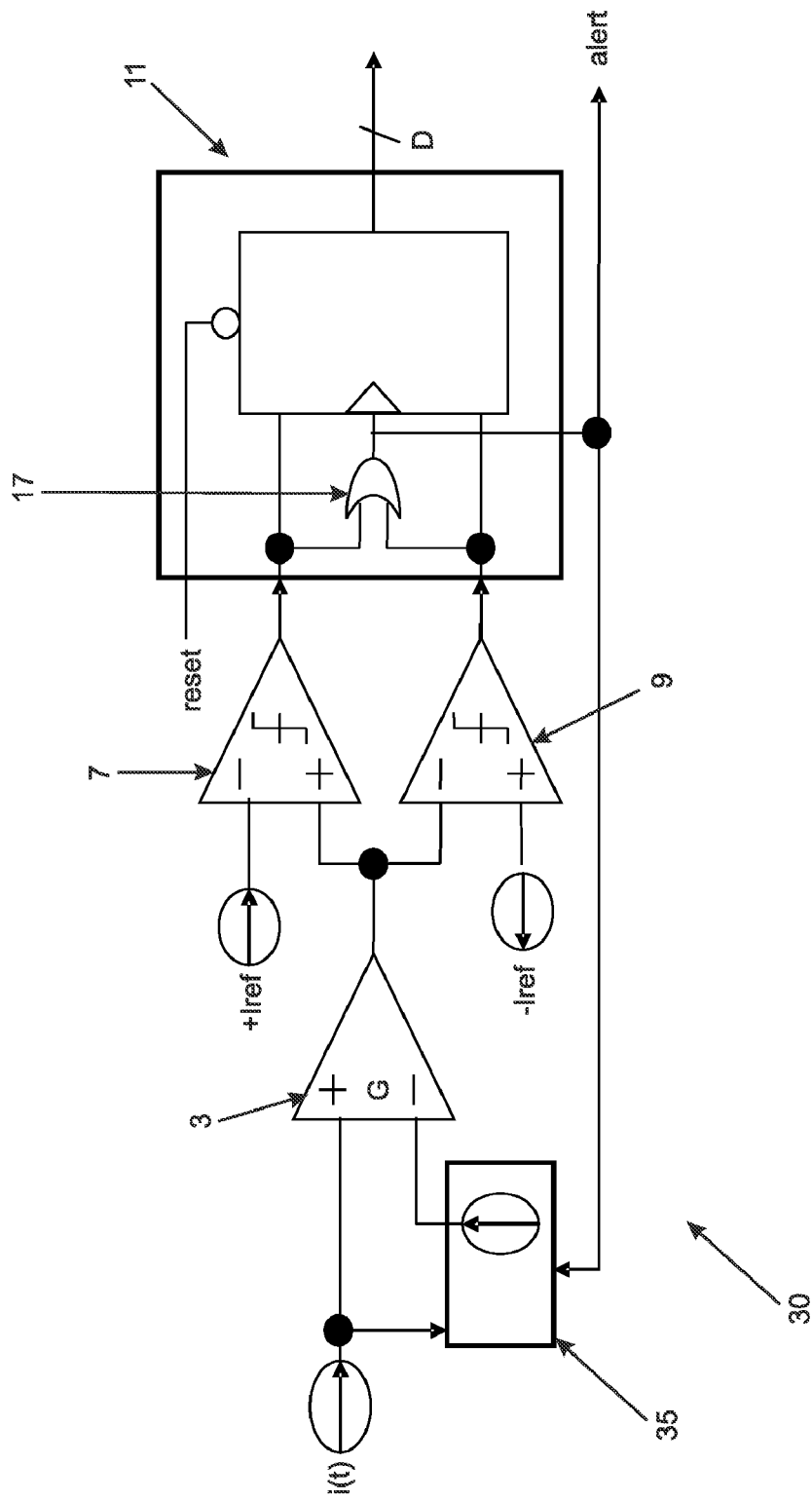
FIG. 3 is a schematic representation of an analogue to digital converter in accordance with a third embodiment of the invention, given by way of example.

Referring to FIG. 3, a third embodiment of the invention comprises an analogue to digital converter (ADC) 30. This is similar to the ADC 1 of FIG. 1, and like reference numerals have been used to denote like components. In this embodiment, the signal sample and hold system 35 comprises a switch and a signal storage device capable of storing a current signal.

The architecture of the ADC 30 of this embodiment of the invention, is based on current sampling of the analogue input signal, as follows.

Before commencing use of the ADC 30, it is intialised. For example, the N-bit counter 11 is reset to initial conditions, it is ensured that the switch of the signal sample and hold system 35 is open and the current signal storage device is discharged.

An analogue signal having a time-varying current, i(t), which is to be converted to a digital signal, is applied to the amplifier/subtracter 3. The current of the analogue signal will initially be zero. As the switch is open, this current signal is not also applied to the current signal storage device. The amplifier/subtracter 3 therefore receives a zero current signal on the input designated +, and a zero current signal on the input designated −. The amplifier/subtracter 3 subtracts the two signals, amplifies the resultant signal, and outputs a zero current signal to each of the comparators 7, 9.

The first comparator 7 receives the zero current signal from the amplifier/subtracter 3 on its input designated +, and receives a signal Iref on its input designated −, where Iref=LSB×G. The first comparator 7 compares the two signals, and as the zero current signal is not greater than Iref, does not output a digital signal to the N-bit counter 11.

The second comparator 9 receives the zero current signal from the amplifier/subtracter 3 on its input designated −, and receives a signal −Iref on its input designated +, where −Iref=−LSB×G. The second comparator 9 compares the two signals, and as the signal −Iref is not greater than the zero current signal does not output a digital signal comprising a 1 to the N-bit counter 11.

The counter portion of the N-bit counter 11 does not therefore receive a signal from either the first comparator 7 or the second comparator 9. The un-amended value of the counter portion, i.e. zero, is output from the ADC 30, as the digital signal, D, equivalent to the zero current analogue signal input into the amplifier/subtracter 3.

The analogue signal having a time-varying current, i(t), which is to be converted to a digital signal, continues to be applied to the amplifier/subtracter 3, and the current of this signal will rise from its initial zero value. As the switch is still open, this current signal is not also applied to the current signal storage device. The amplifier/subtracter 3 therefore receives the current signal, i(t), on the input designated +, and a signal equal to zero on the input designated −. The amplifier/subtracter 3 subtracts the zero signal from the current signal, amplifies the resultant signal by a gain of G, and outputs this to each of the comparators 7, 9. The output signal is therefore (i(t)−0)×G.

The first comparator 7 receives the signal from the amplifier/subtracter 3, (i(t)−0)×G, on its input designated +, and receives a signal Iref on its input designated −, where Iref=LSB×G. The first comparator 7 compares the two signals, and if the signal (i(t)−0)×G is greater than Iref, i.e. if (i(t)−0)×G>LSB×G or (i(t)−0)>LSB, outputs a digital signal comprising a 1 to the N-bit counter 11.

The second comparator 9 receives the signal from the amplifier/subtracter 3, (i(t)−0)×G, on its input designated −, and receives a signal −Iref on its input designated +, where −Iref =−LSB×G. The second comparator 9 compares the two signals, and if the signal −Iref is greater than the signal (i(t)−0)×G, i.e. if −LSB×G>(i(t)−0)×G, or −LSB>(i(t)−0), outputs a digital signal comprising a 1 to the N-bit counter 11.

If the current of the analogue input signal is considered to vary from −1 to +1, and the ADC 30 provides N+1 bit resolution, then 1 LSB=$I/2^N$. The magnitude of the current of the analogue input signal will therefore be greater than 1 LSB, i.e. greater than the magnitude of the signal Iref. So the first comparator 7, but not the second comparator 9, will output a signal to the N-bit counter 11.

On receipt of the signal from the first comparator 7, the counter portion of the N-bit counter 11 is caused to increment by a value of 1. The value of the counter portion is output from the ADC 30, as the digital signal equivalent to the analogue current signal input into the amplifier/subtracter 3.

The OR gate 17 of the N-bit counter 11, also receives the signal from the first comparator 7. On receipt of this, the OR gate 17 outputs a sample control signal to the signal sample and hold system 35. This causes the switch of the signal sample and hold system 35 to temporarily close, and a sample of the current signal, $i(t_n)$, where n represents the sample time, is taken and is stored in the current signal storage device. It will be appreciated that the above process occurs very rapidly, more rapidly than the time variation of the current of the analogue input signal. Therefore the magnitude of the current of the signal sample received by the current signal storage device will be equal to the magnitude of the current signal which was input into the amplifier/subtracter 3.

The current signal stored by the current signal storage device is input into the input designated − of the amplifier/subtracter 3. The input designated + of the amplifier/subtracter 3 continues to receive the time-varying current analogue signal, i(t). The amplifier/subtracter 3 subtracts the current signal received from the current signal storage device from the time-varying current signal, amplifies the resultant signal by a gain of G, and outputs this to each of the comparators 7, 9. The output signal is therefore (i(t)−i($t_n$))×G. The amplifier/subtracter 3 therefore determines the difference between the current of the received time-varying analogue signal, i(t), and a previous value of the current of the analogue signal.

As before, the first comparator 7 receives the signal from the amplifier/subtracter 3, now (i(t)−i($t_n$))×G, on its input designated +, and receives a signal Iref on its input designated −, where Iref=LSB×G. The first comparator 7 compares the two signals, and if the signal (i(t)−i($t_n$))×G is greater than Iref, i.e. if (i(t)−i($t_n$))×G>LSB×G or (i(t)−i($t_n$))>LSB, outputs a digital signal comprising a 1 to the N-bit counter 11.

Also, as before, the second comparator 9 receives the signal from the amplifier/subtracter 3, now (i(t)−i($t_n$))×G, on its input designated −, and receives a signal −Iref on its input designated +, where −Iref=−LSB×G. The second comparator 9 compares the two signals, and if the signal −Iref is greater than the signal (i(t)−i($t_n$))×G, i.e. if −LSB×G>(i(t)−i($t_n$))×G, or −LSB>(i(t)−i($t_n$)), outputs a digital signal comprising a 1 to the N-bit counter 11.

Therefore, if the current of the received time-varying analogue signal, i(t), differs from the previous value of the current of the analogue signal, i($t_n$), by +/−1 LSB, either the first or the second comparator will output a signal. The ADC 30 therefore detects variations of +/−1 LSB in the current of the received analogue signal. If the current of the received time-varying analogue signal, i(t), does not differ from the previous value of the current of the analogue signal, i($t_n$), by +/−1 LSB, neither the first or the second comparator outputs a signal.

If the N-bit counter 11 receives a signal from the first comparator 7, the counter portion thereof is caused to increment by a value of 1. If the N-bit counter 11 receives a signal from the second comparator 9, the counter portion thereof is caused to decrement by a value of 1. The value of the counter portion is, as before, output from the ADC 30, as the digital signal equivalent to the analogue current signal, i(t), input into the amplifier/subtracter 3.

The OR gate 17 of the N-bit counter 11, also receives any signal from the first comparator 7 or second comparator 9. On receipt of this, the OR gate 17 outputs a sample control signal to the signal sample and hold system 35. This causes the switch of the signal sample and hold system 35 to temporarily close, and a sample of the current signal, i($t_{n+1}$), is taken and is stored in the current signal storage device.

At the time the time-varying analogue signal is converted, its current value is exactly known. Each equivalent digital signal, D, is therefore predictable, using D(n)−D(n−1)=+/−1 LSB.

The resolution of the ADC 30 is given by N=log 2 (I/LSB)+1=log 2 (G×I/Iref)+1.

Figure 4:
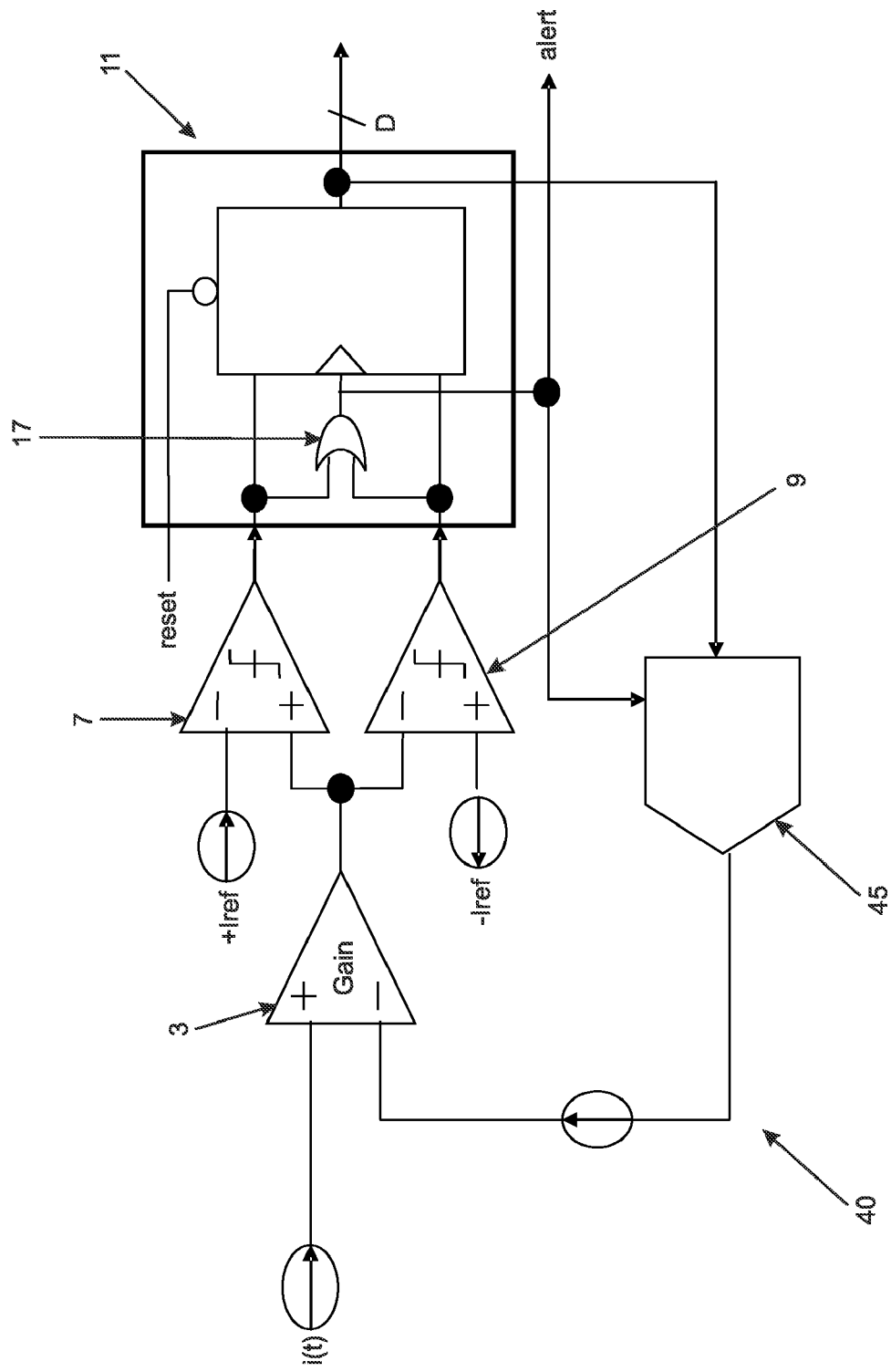
FIG. 4 is a schematic representation of an analogue to digital converter in accordance with a fourth embodiment of the invention, given by way of example.

Referring to FIG. 4, a fourth embodiment of the invention comprises an analogue to digital converter (ADC) 40. This is similar to the ADC 30 of FIG. 3, and like reference numerals have been used to denote like components. In this embodiment of the invention, however, the signal sample and hold system 45 comprises an M-bit digital to analogue converter (DAC), where M>N. This replaces the switch and current signal storage device of the signal sample and hold system 35. The advantages of this are that there is no need for provision of a switch and current signal storage device in the signal sample and hold system, and therefore no leakage of the current signal storage device. The drawbacks are increased power consumption of the ADC 40 and an increase in size of the ADC 40.

The embodiments of the ADC of the invention can convert time-varying analogue input signals. Constant analogue input signals can be accommodated by transforming them to a time-varying analogue input signal.

The operation of each embodiment of the ADC of the invention is in contrast with that of conventional ADCs. In these, time sampling is used to sample the analogue input signal, and this requires use of a clock. In the embodiments of the ADC of the invention, either voltage or current sampling is used to sample the analogue signal input to the ADC, and this does not require use of a clock. This provides the desired power consumption improvement.

The embodiments of the ADC of the invention provide a number of advantages over conventional ADCs. The embodiments of the ADC have a reduced power consumption, in comparison to that of conventional ADCs. This is due to the lack of a clock in the ADCs, with subsequent reduction in power consumption. The ADCs of the invention achieve an increase in resolution, by digital post-processing of the converted signals, made possible by the voltage or current sampling architecture of the ADCs. The ADCs of the invention further provide reduced conversion times of the input signals. The absence of a clock system, and automatic monitoring of any voltage or current variation of the input signal, allows simplification of the on-chip design of the ADCs of the invention, optimisation of size of the ADCs, and a reduction in design cycle time. This reduces the cost of the ADCs. The ADCs further provide flexibility, in that each can be easily extended to middle/high resolution and/or high speed.

The embodiments of the ADC of the invention are suitable for use in any application that requires signal conversion, and are particularly pertinent to 'low resource environments', i.e. where availability of resources such as power and allowed ADC area is low, and applications which require increased conversion speed and reduced resolution. The ADCs of the invention may be implemented, for example, in portable devices such as cellular phones, laptop computers and heart pacemakers, in instrumentation/measurement applications, in audio and video applications such as audio data converters, in automotive applications, and in medical applications etc.

Referring to portable device applications discussed in the introduction, the embodiments of the ADC of the invention are particularly useful in this application, in the monitoring of the voltage of the battery of a device. The lack of use of a clock by the ADCs reduces the power consumption of the ADCs, and hence monitoring of battery voltage can be carried out during an operational mode of the device with reduced power consumption. Monitoring of battery voltage can also be carried out during a stand-by mode of the device, as no clock is needed, also with reduced power consumption. These help to optimise the life time of the power source of the device.

If, however, the voltage of the power source (e.g. battery) of the device remains constant for a long period of time, false analogue to digital conversions may occur, if any of the embodiments of the ADC detects a drop in the analogue signal of 1 LSB. This may occur due to voltage/current leakage of the signal storage device of the signal sample and hold system of the ADCs of FIG. 1 or 3, leading to a false detection of a 1 LSB signal shift. This may result in a constant increase of the output digital signal. This problem may be solved by periodically reinitialising the ADC, using the always-available low frequency clock. The ADC will take, for example, approximately 10 µs maximum, to output the correct digital signal, and the period of free-running of the ADC should be at worst for example 200 µs. As the native low frequency clock is only used for refreshment purposes, its use does not significantly increase either power consumption or size of the ADC.

The invention claimed is:

1. An analogue to digital converter (ADC) comprising;
a signal sampling device;
a signal comparison device; and a digital signal generator;
wherein an analogue signal to be converted to a digital signal is input into the ADC, the signal sampling device produces samples of the analogue signal, the signal comparison device receives the analogue signal and the analogue signal samples, performs a comparison between them and outputs comparison signals, and the digital signal generator receives the comparison signals and uses them to generate a digital signal;
wherein the signal comparison device compares the analogue signal with the samples of the analogue signal, by determining the difference between the analogue signal and a previously-taken sample of the analogue signal, and the digital signal generator receives a comparison signal comprising the difference between the analogue signal and the previously-taken sample of the analogue signal, and generates a digital signal if the comparison signal exceeds a pre-determined non-zero threshold value; and
the signal sampling device to record a sample of the analogue signal in response to the comparison signal indicating the difference between the analogue signal and the previously taken sample of the analogue signal is equivalent to at least one least significant bit of a digital value generated by the analogue to digital converter.

2. An ADC as claimed in claim 1, wherein the digital signal generator comprises a first comparator, a second comparator and an N-bit counter, the first and second comparators receive the comparison signals, determine if the comparison signal exceeds the pre-determined threshold value and if this is the case, output a signal to the N-bit counter which produces a digital signal and causes the signal sampling means to produce an analogue signal sample.

3. An ADC as claimed in claim 1, wherein the signal sampling device produces voltage samples of the analogue signal.

4. An ADC as claimed in claim 3, wherein the signal sampling device comprises a switch which is periodically opened to receive the analogue signal and produce voltage analogue signal samples.

5. An ADC as claimed in claim 4, wherein the signal sampling device further comprises a signal storage device which stores the voltage analogue signal samples and outputs these to the signal comparison device.

6. An ADC as claimed in claim 3, wherein the signal sampling device comprises a digital to analogue converter which receives digital signals equivalent to the analogue signal, and converts the digital signals into voltage analogue signal samples.

7. An ADC according to claim 1, wherein the signal sampling device produces current samples of the analogue signal.

8. An ADC as claimed in claim 7, wherein the signal sampling device comprises a switch which is periodically opened to receive the analogue signal and produce current analogue signal samples.

9. An ADC as claimed in claim 8, wherein the signal sampling device further comprises a signal storage device which stores the current analogue signal samples and outputs these to the signal comparison device.

10. An ADC as claimed in claim 7, wherein the signal sampling device comprises a digital to analogue converter which receives digital signals equivalent to the analogue signal, and converts the digital signals into current analogue signal samples.

11. An ADC as claimed in claim 1, wherein operation of the signal sampling device to produce analogue signal samples is controlled by the digital signal generator.

12. A method of converting an analogue signal to a digital signal, comprising;
producing samples of the analogue signal;
performing a comparison between the analogue signal and the analogue signal samples to produce comparison signals; and
using the comparison signals to generate a digital signal;
wherein the step of performing a comparison between the analogue signal and the analogue signal samples to produce comparison results comprises determining the difference between the analogue signal and a previously-taken sample of the analogue signal; and wherein the step of using the comparison signals to generate a digital signal comprises generating a digital signal if the comparison signal exceeds a pre-determined non-zero threshold value; and
recording a sample of the analogue signal in response to the comparison signal indicating the difference between the analogue signal and the previously-taken sample of the analogue signal is equivalent to at least one least significant bit of a digital value based on the digital signal.

13. An ADC as claimed in claim 2, wherein the signal sampling device produces voltage samples of the analogue signal.

14. An ADC according to claim 2, wherein the signal sampling device produces current samples of the analogue signal.

15. An ADC as claimed in claim 2, wherein operation of the signal sampling device to produce analogue signal samples is controlled by the digital signal generator.

16. An ADC as claimed in claim 3, wherein operation of the signal sampling device to produce analogue signal samples is controlled by the digital signal generator.

17. An ADC as claimed in claim 4, wherein operation of the signal sampling device to produce analogue signal samples is controlled by the digital signal generator.

18. An ADC as claimed in claim 5, wherein operation of the signal sampling device to produce analogue signal samples is controlled by the digital signal generator.

19. An ADC as claimed in claim 6, wherein operation of the signal sampling device to produce analogue signal samples is controlled by the digital signal generator.

20. An ADC as claimed in claim 7, wherein operation of the signal sampling device to produce analogue signal samples is controlled by the digital signal generator.

* * * * *